United States Patent
Kelley et al.

(10) Patent No.: US 6,168,995 B1
(45) Date of Patent: Jan. 2, 2001

(54) METHOD OF FABRICATING A SPLIT GATE MEMORY CELL

(75) Inventors: Patrick J. Kelley; Chung Wai Leung; Ranbir Singh, all of Orlando, FL (US)

(73) Assignee: Lucent Technologies Inc., Murray Hill, NJ (US)

( * ) Notice: Under 35 U.S.C. 154(b), the term of this patent shall be extended for 0 days.

(21) Appl. No.: 09/460,652

(22) Filed: Dec. 14, 1999

Related U.S. Application Data

(60) Provisional application No. 60/115,602, filed on Jan. 12, 1999.

(51) Int. Cl.⁷ ............................................... H01L 21/8247
(52) U.S. Cl. .............................................................. 438/266
(58) Field of Search ...................................... 438/257–267

(56) References Cited

U.S. PATENT DOCUMENTS

| | | | |
|---|---|---|---|
| 5,049,516 | * | 9/1991 | Arima . |
| 5,273,923 | * | 12/1993 | Chang et al. . |
| 5,439,838 | * | 8/1995 | Yang . |
| 5,877,523 | * | 3/1999 | Liang et al. ........................... 257/315 |
| 5,920,776 | * | 7/1999 | Fratin et al. ........................... 438/257 |

* cited by examiner

*Primary Examiner*—Richard Booth

(57) ABSTRACT

A method of fabricating a novel split gate memory cell comprises forming a tunnel oxide layer on a silicon substrate, forming a first conductive layer over said tunnel oxide layer, etching a trench in said conductive layer to divide said conductive layer into two separate layers with a space therebetween, one such layer to become a first gate electrode and the other separate layer to become a floating gate electrode of the device, forming a dielectric layer over the exposed surfaces, and depositing a second conductive layer which will become a second control gate electrode over said dielectric layer.

8 Claims, 4 Drawing Sheets

METHOD OF FABRICATING A SPLIT GATE MEMORY CELL

RELATED APPLICATIONS

This Application claims the benefit of U.S. Provisional Application Ser. No. 60/115,602, filed Jan. 12, 1999.

BACKGROUND OF THE INVENTION

1. Field of the Invention

The present invention relates to a method for fabricating a memory cell and more particularly a method for fabricating a split gate memory cell useful for low voltage operation.

2. Description of the Prior Art

As device technology scales down, doping concentrations in devices keep increasing. The resultant decrease in oxide/junction breakdown voltage makes it difficult to utilize high voltages required for the operation of non-volatile (NV) memory cells. Further, in the select gate of a split-gate memory cell itself, one needs relatively thicker gate oxides to prevent oxide breakdown. This makes it difficult to scale the Vt's of the select gate device and thus leads to poorer low voltage operation.

Scientists at Samsung Corp. have proposed the idea of a built-in charge pump for use in stacked gate cells (termed Boosted wordline cell) in an effort to address the aforementioned problems. The cells proposed by Samsung require the use of a triple poly structure. The present invention addresses the aforementioned problems through the use of a novel cell have a two-poly structure.

SUMMARY OF THE INVENTION

The present invention comprises a method of fabricating a novel split gate memory cell.

The novel split gate cell comprises a silicon substrate having a tunnel oxide layer on a portion of its surface and a first control gate and a floating gate electrode spaced from each other and preferably formed from the same material over the tunnel oxide. A dielectric layer overlies the first control gate and the floating gate electrodes, including the surface of the electrodes in the area between them. A second control gate, which is physically separated from the first control gate is provide over the dielectric layer and in the space between the first control gate and the floating gate. A highly doped region may be provided in the silicon substrate in the region under the separation of the first control gate and the floating gate. Source and drain regions are also provided in the substrate which may include adjacent halo implants.

The novel memory cell is fabricated by providing a tunnel oxide layer on the surface of a silicon substrate; forming a conductive layer over the tunnel oxide; forming a space in the conductive layer so as to provide a control gate and a floating gate electrode separated from each other but made from the same deposited or grown layer; forming a highly doped region in the substrate below the space between the aforementioned electrodes; forming a dielectric layer over the surfaces of the aforementioned electrodes; and forming a second control gate over the dielectric layer.

DETAILED DESCRIPTION OF THE INVENTION

Definitions: As used herein, including the drawings, FG is a storage node made of floating gate polysilicon or other conductor; CG-1 is a control gate also made from polysilicon or other appropriate conductor; and CG-2 is a control gate made of polysilicon, which may be silicided, or other conductor. The FG and CG-1 layers are sometimes referred to as poly-1 since they are formed from the same deposited or grown layer (poly-1). The CG-2 gate is sometimes referred to as poly-2 as it is formed from a deposited layer designated as poly-2. Polysilicon is preferred over other conductors for both the poly-1 and poly-2 layers.

Figure 3A:
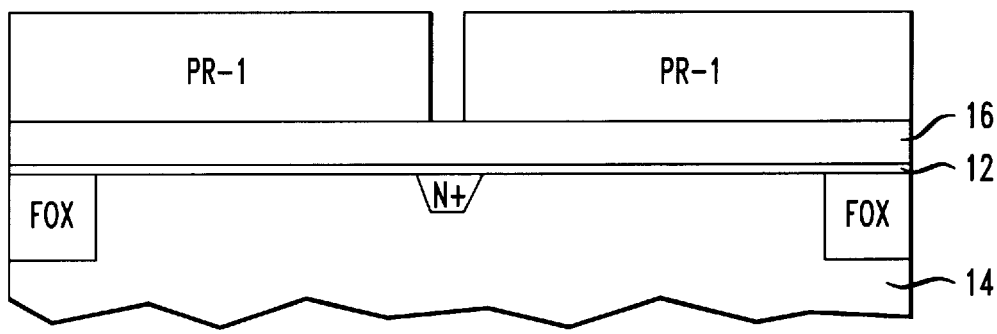
FIGS. 3A–5B are sectional views illustrating the steps for fabricating the novel cell.
Figure 3B:
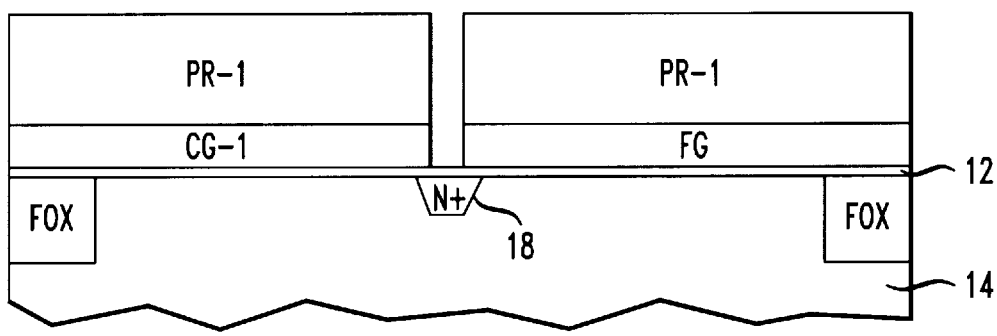
Figure 4A:
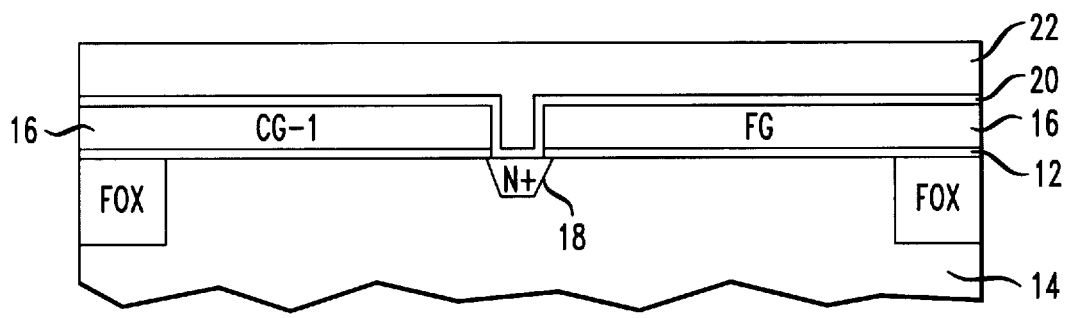
Figure 4B:
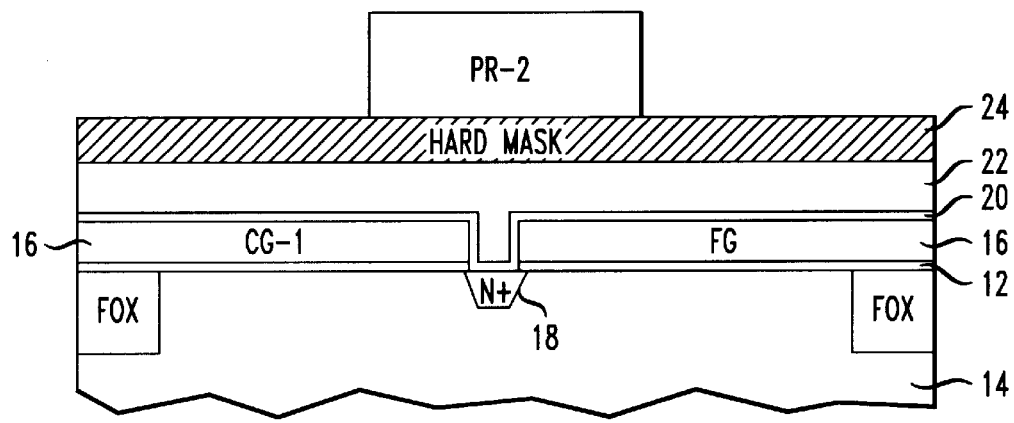

As can be seen with reference to FIGS. 3–5, the process for making the novel device 10 includes the growth of a tunnel oxide 12 on a silicon substrate 14 after conventional IC isolation and active area definition steps have been finished. Typically, the thickness of the tunnel oxide is from 50–150 A and preferably between about 80–100 A. An in-situ doped polysilicon layer, poly-1, (or other conductor) 16 is then deposited. The poly-1 is then patterned by means of a thick gate photoresist (PR-1), as shown in FIG. 3A and the device is etched to form the individual, separated FG and CG-1 structures as shown in FIG. 3B. Although not necessary for the operation of the device, one can, using oxide or other dielectric spacers, easily define a very small space (~0.1 $\mu$m) between the FG and CG-1 poly-1.

Figure 5A:
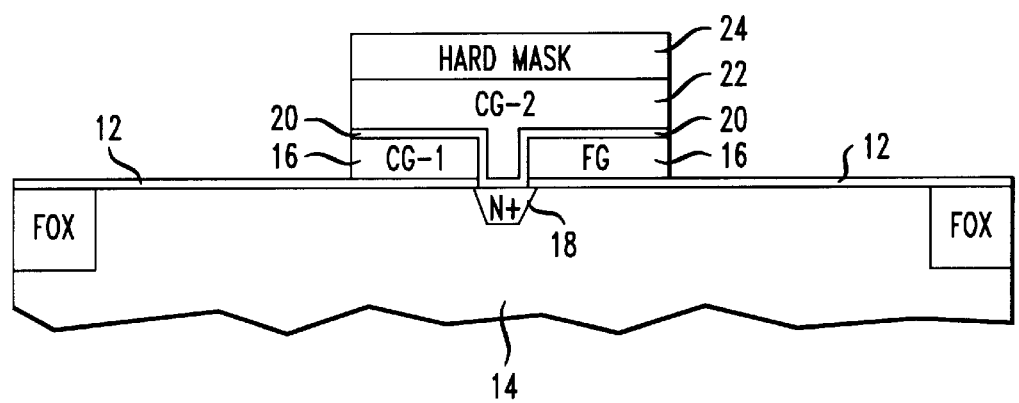

An optional $N^+$ ion implant 18 in the silicon wafer substrate 14 in the region of the separation between CG-1 and FG (see FIG. 3B) is preferably performed. The resist, PR-1, used for implantation is removed, the tunnel oxide etched, and an interpoly dielectric layer 20 is deposited on the wafers to isolate the poly-1 CG-1 and FG structures from the subsequently deposited poly-2 layer 22. The interpoly dielectric layer 20 can be made of silicon dioxide, an ONO (oxide/nitride/oxide) composite or a known high K dielectric to achieve the necessary coupling. Typically, the interpoly layer 20 is from 50–300 A thick and and generally about 180 A thick for a silicon oxide layer. It should be noted that the thickness of the interpoly layer 20 depends upon the material employed for that layer. Optionally, using a photoresist, the dielectric may be removed from selected areas where a gate-dielectric thinner than the high voltage dielectric may be needed, e.g. for embedded applications, analogous to the thick gate operation. As can be seen with reference to FIGS. 4A and 4B, a disposable hard mask 24 is deposited over the poly-2 layer 22. A gate photoresist, PR-2, is then deposited over the hard mask 24 so as to define the width of the split gate cell and the device is etched, stopping after the poly-2 layer 22. The core CMOS area is protected with a photoresist (not shown), and the memory cell area is opened for a gate stack etch. First the interpoly dielectric layer 20 and then the FG and CG-1 poly-1 layers 16 are etched, stopping at the tunnel oxide 12 (FIG. 5A).

Figure 2:
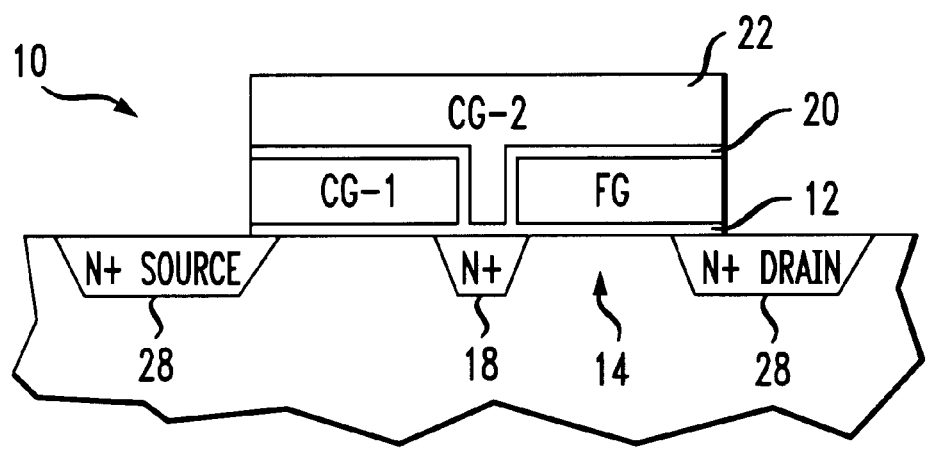
FIG. 2 is a sectional view of an embodiment of the cell of the present invention.
Figure 5B:
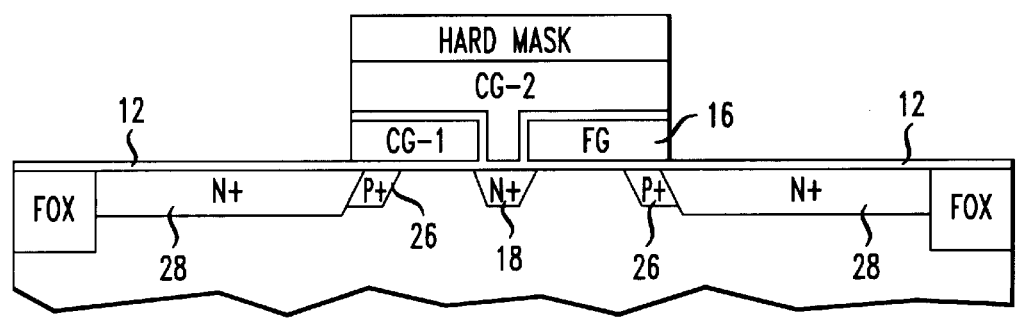

A source/drain halo ion implant 26 is then implanted, followed by a heavy dose source/drain arsenic ion implant 28 resulting in the structure shown in FIG. 5B. Boron, boron fluoride or any other P-type dopant, implanted preferably with a large tilt angle can be used for the drain halo implant 26. Where desired, by adding another mask, one can easily make an assymetric device with, for example, a halo implant in the drain end only. Such assymetric device generally exhibits a higher read current and has a higher speed as compared with the symmetrical device depicted in the Figures. Next, conventional core CMOS processing is completed, and the hard-mask 24 is removed as part of the core CMOS process to arrive at the novel device represented by FIG. 2. With contacts open to drain, source, CG-1 and CG-2, the device may be used as a NVRAM for low voltage operation. Also, it may be noted that the process sequence allows one to use thicker oxides, formed by the composite of deposited HTO and grown oxide, for use in high voltage devices.

Figure 6:
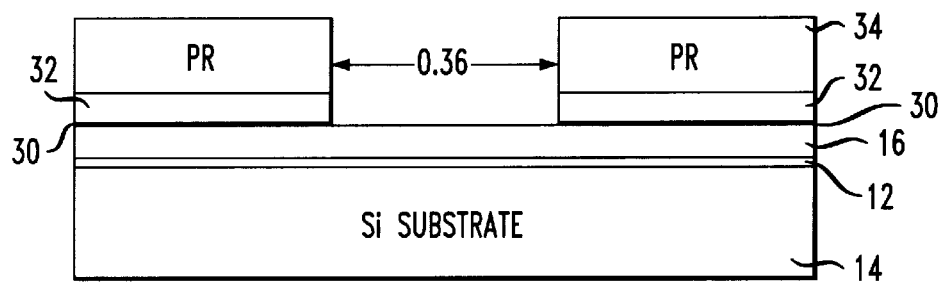
FIGS. 6–8 are sectional views directed to the fabrication of a small space between the floating gate poly storage node and the floating gate poly of control gate 1.
Figure 7:
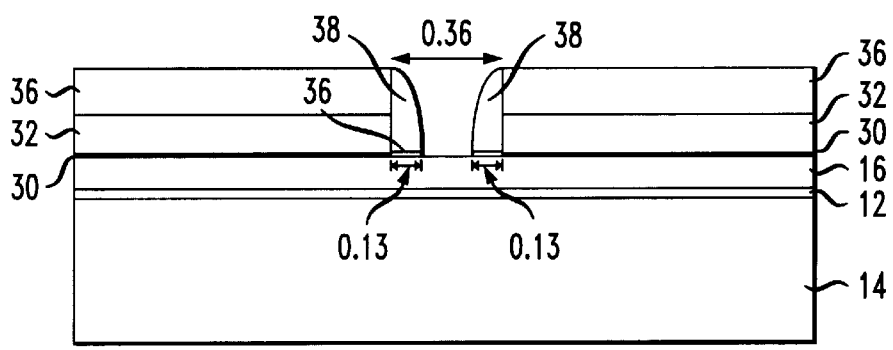
Figure 8:
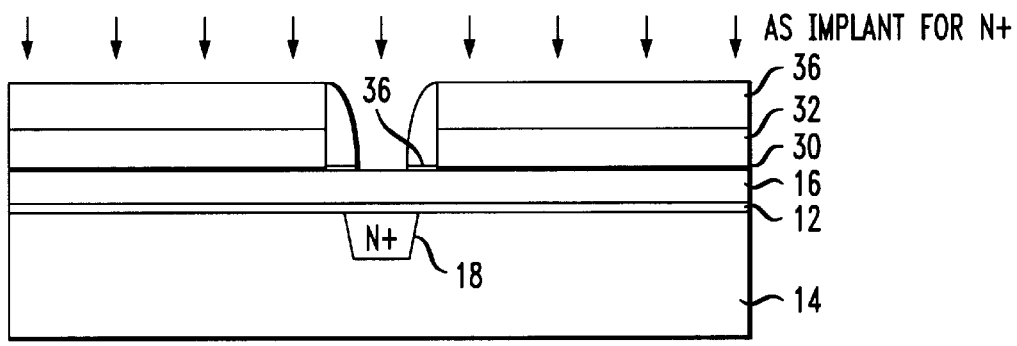

A preferred process for making a small space between FG and CG-1 is shown with reference to FIGS. 6–8. The process comprises growing the tunnel oxide 12, depositing the poly-1 layer 16, depositing a thin undoped silicon oxide dopant mask layer 30 followed by the deposition of a disposable doped oxide layer 32, e.g. a boron-phosphorous silicate glass (BPTEOS). A patterned photoresist layer 34 is provided and the device is etched removing the exposed portion of the doped oxide layer 32 and undoped oxide mask layer 30 stopping at poly-1. This results in the structure shown in FIG. 6. The photoresist 34 is then removed, the surface is cleaned and a disposable oxide dopant mask 36 is grown/deposited. A BPTEOS spacer oxide 38 is deposited and a timed spacer etch is performed to reach the structure of FIG. 7. Finally, the poly-1 layer 16 is etched to form the separated CG-1 and FG areas. As previously indicated and as shown in FIG. 8, a N-type dopant (e.g. AS) is implanted in the space between the CG-1 and FG areas. Thereafter, the disposable oxide is etched away in an ammonium hydroxide/hydrogen peroxide bath. Device formation may then proceed essentially as described above with reference to FIGS. 4A, 4B, 5A and 5B.

Device Operation.

Figure 1:
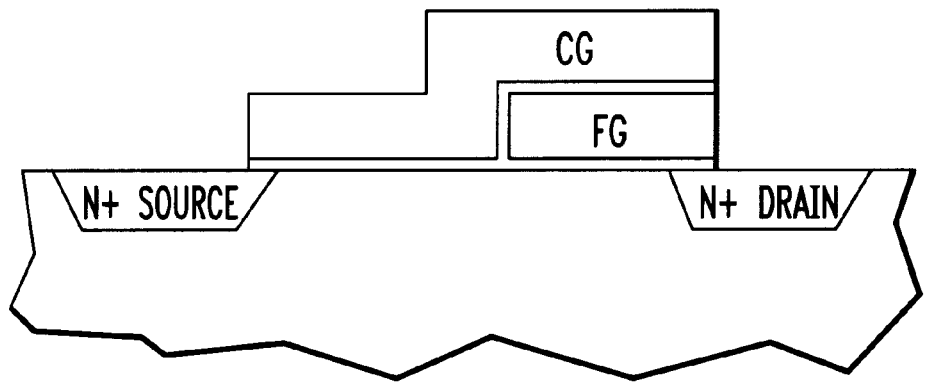
FIG. 1 is a sectional view of a conventional prior art split gate cell.

In a conventional prior art split gate device as shown in FIG. 1, the control gates, CG-1 and CG-2, are made of the same polysilicon and are physically connected. Also, the thickness of the tunneling oxides under the FG and CG gates are generally different, making fabrication more complex. In operation of the prior art device, one needs to apply a large voltage (~7.5V) on the control gate to achieve programming in a short time (~a few 10's of µs). This however does not allow one to scale the underlying select-gate oxide. In the present invention, the voltage on CG-1 can be limited to ~5V so that one can use the tunnel oxide as the gate of the select-gate oxide. The coupling ratio between the CG-2 and the CG-1 can be high, e.g. ~0.6, which is approximately similar to the coupling between CG-2 and FG.

PROGRAMMING OF THE DEVICE In order to program the novel device, a voltage is first applied to CG-2 (e.g. ~5.0V). Then the node CG-2 is electrically floated and the voltage on CG-1 is brought up, e.g. to ~5V. The coupling between CG-1 and CG-2 is about 0.6 so the voltage on CG-2 is increased to ~8V. Next the drain may be pulsed to initiate hot carrier generation and injection into the FG. Thus, the built in voltage boost on CG-2 allows one to achieve device programming even when power supplies are limited to lower voltages.

Another advantage of using the structure of this invention is that the vertical field in the injection region can be independent of the select-gate voltage. Thus, if one chooses, one can apply a large voltage to CG-2 to increase the vertical field and at the same time apply a small voltage to CG-1 to limit programming current and thus improve injection efficiency, as is done in source side injection cells. Such a programming scheme allows one to conserve power in low power applications.

ERASURE: In a conventional split gate device, during erase a large negative voltage is applied to CG-2 and the drain is held at a large positive voltage. Such a scheme is also possible in the structure of the present invention. With CG-1 open and CG-2 at a negative voltage a positive drain voltage can duplicate the erase of a conventional split gate cell. However, the present cell offers the option of using a lower voltage charge pump and using the built-in charge pump for erase, in a manner analogous to programming but with negative voltages.

Further, in conventional split-gate cells, such as that shown in FIG. 1, channel erase is difficult to achieve due to the large coupling ratio between the substrate and FG. Due to this coupling one needs very large substrate voltages, e.g. >15V, to initiate tunneling from the floating gate to the substrate. This voltage appears across the select gate oxide and in order to prevent dielectric breakdown, thicker oxides than those required in the device of the present invention would be required. However, such thicker oxides degrade device performance. In contrast, one can readily utilize a channel erase in the present invention. Here, even if 15 volts is applied to the substrate, one can hold CG1 at 7.5V, with CG2 at 0V and thus the fields across the oxides in the select gate region is <7.5V in all cases.

READ: Read of the devices can follow in a normal fashion with the exception that during read, both CG-1 and CG-2 are brought up to the wordline voltage. The effective capacitance of the wordline is thus similar in value to what it would be for a conventional split gate device (with a thinner gate oxide). With a thinner select-gate oxide (cf. to a conventional split gate cell), a higher on-current and thus a higher read speed is to be expected.

What is claimed is:

1. A method of fabricating a split gate memory cell device comprising forming a tunnel oxide layer on a silicon substrate, forming a first conductive layer over said tunnel oxide layer, etching a trench in said conductive layer to divide said conductive layer into two separate layers with a space therebetween, one such layer to become a first control gate electrode and the other separate layer to become a floating gate electrode of the device, forming a dielectric layer over the exposed surface, depositing a second conductive layer which will become a second control gate electrode over said dielectric layer, and forming a first halo implant region in the substrate under the edge area of the first control gate electrode and adjacent to at least an ion implanted drain region, and forming a second halo implant simultaneously with said first halo implant region under the edge area of the floating gate electrode and adjacent an ion implanted source region.

2. The method recited in claim 1 further comprising the step of forming a highly doped ion-implant region in said substrate below said trench, subsequent to forming the floating gate electrode and prior to depositing the second conductive layer.

3. The method set forth in claim 1 further comprising the steps of forming a hard mask over said second conductive layer, applying a photoresist mask over a portion of the hard mask including the area above the trench, etching the layers not protected by the photoresist so as to define the width of the device electrodes, and implanting source and drain regions in the substrate.

4. The method recited in claim 1 wherein the first and second conductive layers are comprised of polysilicon.

5. The method recited in claim 4 wherein the second conductive layer is silicided.

6. The method recited in claim 4 wherein the tunnel oxide and the dielectric layers comprise silicon dioxide.

7. The method recited in claim 2 further wherein the first and second conductive layers comprise polysilicon and said ion implanted regions are of the $n^+$-type.

8. The method recited in claim 2 wherein the first conductive layer is polysilicon and the trench is formed therein by forming an undoped silicon dioxide mask over the first conductive layer and a disposable doped silicon oxide layer over the undoped silicon dioxide layer, depositing a patterned photoresist layer over the doped silicon oxide layer, removing an exposed portion of the doped oxide layer and undoped silicon dioxide mask layer, stopping at the first polsysilicon layer, removing the photoresist, forming a disposable oxide dopant mask, depositing a doped spacer silicon dioxide followed by a timed spacer etch, and etching the first polysilicon layer to form the separated first control gate and floating gate electrodes having a space therebetween defined by the steps set forth herein.

\* \* \* \* \*